(12) United States Patent
Hironaka et al.

(10) Patent No.: US 7,550,807 B2
(45) Date of Patent: Jun. 23, 2009

(54) SEMICONDUCTOR MEMORY

(75) Inventors: Katsuya Hironaka, Fukuyama (JP); Shinichi Sato, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 404 days.

(21) Appl. No.: 11/418,112

(22) Filed: May 5, 2006

(65) Prior Publication Data
US 2006/0258108 A1 Nov. 16, 2006

(30) Foreign Application Priority Data
May 10, 2005 (JP) ............... 2005-137541

(51) Int. Cl.
*H01L 29/94* (2006.01)
*H01L 21/336* (2006.01)
*H01L 31/062* (2006.01)

(52) U.S. Cl. ..................... 257/382; 438/301

(58) Field of Classification Search ............... 257/382, 257/315, 377; 438/163, 174, 276, 301
See application file for complete search history.

(56) References Cited

U.S. PATENT DOCUMENTS

| | | | |
|---|---|---|---|
| 5,233,210 A | 8/1993 | Kodama | |
| 5,592,000 A | 1/1997 | Onishi et al. | |
| 6,103,574 A | 8/2000 | Iwasaki | |
| 6,747,321 B2 * | 6/2004 | Kanamori | 257/382 |
| 2003/0020109 A1 | 1/2003 | Shimizu | |
| 2003/0222318 A1 | 12/2003 | Tanaka et al. | |
| 2004/0079987 A1 * | 4/2004 | Shimizu | 257/315 |
| 2004/0251521 A1 | 12/2004 | Tanaka et al. | |
| 2007/0215958 A1 | 9/2007 | Tanaka et al. | |

FOREIGN PATENT DOCUMENTS

| | | |
|---|---|---|
| JP | 2000-036546 | 2/2000 |
| JP | 2003-037193 | 2/2003 |
| KR | 10-2003-0093122 A | 12/2003 |
| KR | 10-2005-0037546 A | 4/2005 |

* cited by examiner

*Primary Examiner*—Calvin Lee
(74) *Attorney, Agent, or Firm*—Harness, Dickey & Pierce, P.L.C.

(57) ABSTRACT

In the non-volatile semiconductor memory in which an N-type source diffusion layer and an N-type drain diffusion layer are formed on a P-type well formed on a substrate: the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer; a silicide is formed to cover the upper-wall layer, the lower-wall layer, and the side-wall layer, and an insulating layer is formed to cover the silicide; and a distance d between (a) an interface between the insulating layer and the silicide formed on the upper-wall layer and (b) an interface between the insulating layer and the silicide formed on the lower-wall layer is 1000 Å or shorter. This structure allows (i) miniaturization of the non-volatile semiconductor memory and (ii) reduction in a resistance of the source diffusion layer of the non-volatile semiconductor memory.

18 Claims, 6 Drawing Sheets

SEMICONDUCTOR MEMORY

This Nonprovisional application claims priority under 35 U.S.C. § 119(a) on Patent Application No. 137541/2005 filed in Japan on May 10, 2005, the entire contents of which are hereby incorporated by reference.

FIELD OF THE INVENTION

The present invention relates to a semiconductor memory (e.g., non-volatile memory), and in particular, to (i) a structure of a source diffusion layer and (ii) a fabrication method thereof.

BACKGROUND OF THE INVENTION

For isolation of a structure in a non-volatile semiconductor memory (e.g., flash memory), a trench isolation is commonly employed. The trench isolation, however, has a problem that a resistance of a source diffusion layer is increased when the source diffusion layer is formed by implantation using self-align source etching that employs anisotropic dry etching. Moreover, with the trench isolation, the side wall of the trench is inclined sharply at an angle close to 0°. Therefore, it has been difficult to form a low-resistance source diffusion layer wiring on the side wall by ion-implantation.

As a countermeasure, Japanese Unexamined Patent Publication No. 2003-37193 (published on Feb. 7, 2003) teaches a method in which the isolation layer has a protrusion portion and a depressed portion, and the source diffusion layer is formed below the level of a bottom surface of the depressed portion. With this method, the resistance of the source diffusion layer can be reduced.

However, in order to form the source diffusion layer in such a deep portion, high energy is required for ion-implantation of impurity. The publication teaches a method in which the implantation is performed, using ion-implantation energy of 120K eV, from two directions at an angle of 45°. However, in the case where the diffusion layer is formed by ion-implantation, the diffusion layer expands in dependence upon the ion implantation energy, along a direction orthogonal to the direction of the ion-implantation. Therefore, if a source region is formed using a high energy such as 120K eV, the source region would expand along the direction orthogonal to the direction of extension of the source diffusion layer. This makes it difficult to shorten the width of the gate line by taking advantage of a short channel effect. Thus, the semiconductor memory cannot be miniaturized.

Further, Japanese Unexamined Patent Publication No. 2000-36546 (published on Feb. 2, 2000) teaches a structure in which a side wall of trench has a greater angle than the ion-implantation angle. With this structure, a source diffusion layer with a low resistance is formed. This publication teaches setting the ion-implantation angle at 7° so that (i) extrusion of ions can be prevented and (ii) efficiency of the implantation can be improved. However, as the implantation angle becomes wider, the number of ions implanted on the right trench side-wall layer and that implanted on the left trench side-wall layer become increasingly different. This increases the resistance in the side wall having a lower density. As a result, the resistance of the source diffusion layer is increased.

SUMMARY OF THE INVENTION

The present invention has as an object to provide a semiconductor memory that can realize miniaturization and reduce resistance of a source diffusion layer.

The non-volatile semiconductor memory of the present invention is adapted so that, in a semiconductor memory in which a source diffusion layer and a drain diffusion layer are formed on a semiconductor substrate: the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer; a silicide is formed to cover the upper-wall layer, the lower-wall layer, and the side-wall layer; and a distance between (a) an interface between the upper-wall layer and the silicide and (b) an interface between the lower-wall layer and the silicide is 1000 Å or shorter.

As the foregoing describes, by (i) making the distance between (a) the interface between the upper-wall layer and the silicide and (b) the interface between the lower-wall layer and the silicide 1000 Å or shorter and (ii) making the depressed portion (trench) of the source diffusion layer shallow, the proportion of the side-wall layer in the source diffusion layer can be reduced. This makes it possible to shorten the path of the source diffusion layer, and therefore the resistance thereof can be reduced. Further, because the resistance is reduced by forming the silicide, it is not necessary to reduce the resistance at the time of forming the source diffusion layer by impurity implantation. This makes it possible to perform the implantation with less energy and less dosage. Therefore, the source diffusion layer can be prevented from expanding in the width direction (length in the direction orthogonal to the direction of extension), and miniaturization of the semiconductor memory can be realized. Further, in forming the silicide, the metal film (e.g., cobalt film) can be deposited with good coverage. Therefore, (i) an increase in resistance and (ii) wire breakage, both of which may occur if the silicide is formed improperly, can be prevented. Further, because no isolation layer is formed and the source diffusion layer is continuously formed, less implantation energy (than that in the case where the isolation layer is provided) is required for the impurity implantation performed to form the source diffusion layer. This makes it possible to miniaturize the source diffusion layer. As a result, (i) miniaturization of the semiconductor memory and (ii) reduction in the resistance of the source diffusion layer can be realized.

Additional objects, features, and strengths of the present invention will be made clear by the description below. Further, the advantages of the present invention will be evident from the following explanation in reference to the drawings.

DESCRIPTION OF THE EMBODIMENTS

The following describes an embodiment of the present invention, with reference to FIGS. 1 to 9.

Figure 1:
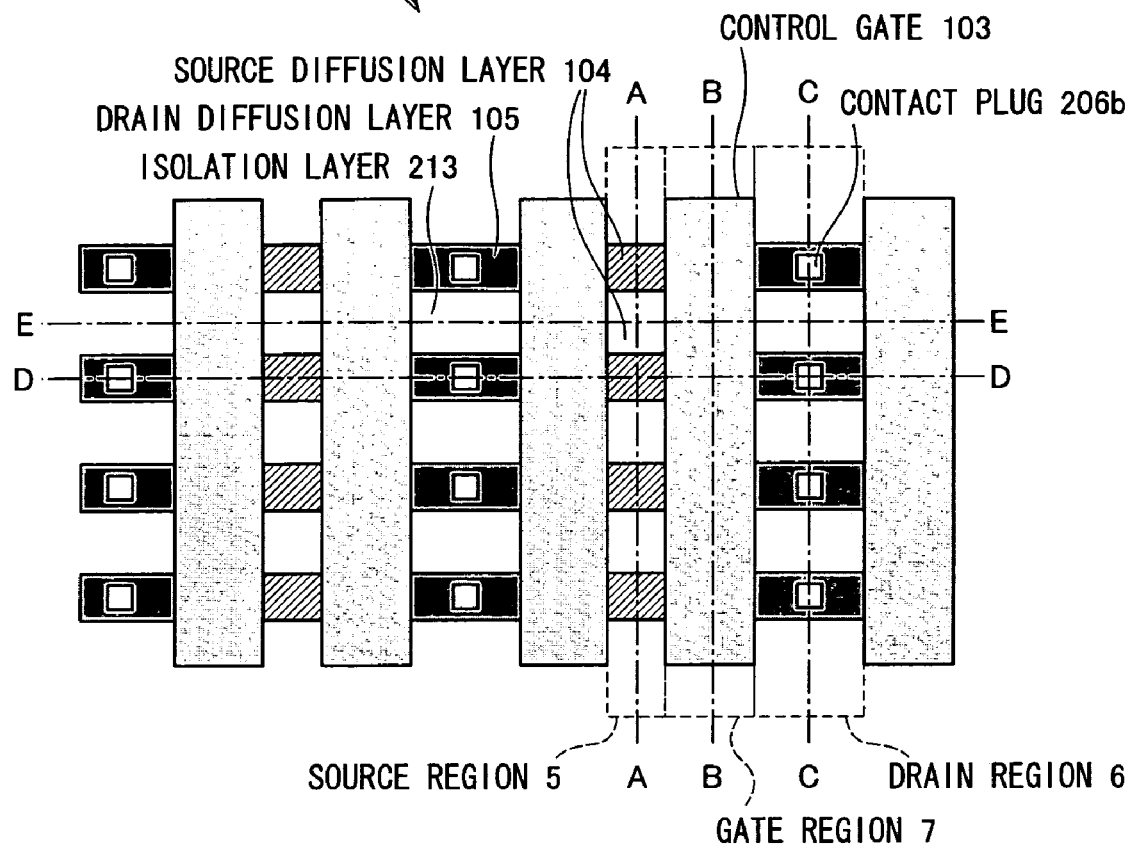
FIG. 1 is a plane view of a non-volatile semiconductor memory of the present invention.

FIG. 1 is a perspective plane diagram illustrating a non-volatile semiconductor memory of the present embodiment. FIGS. 2 to 6 are cross sectional diagrams illustrating the non-volatile semiconductor memory.

As illustrated in FIGS. 1 to 6, the non-volatile semiconductor memory 1 of the present invention is provided with: a P-type well 2 formed on a substrate 4; a control gate 103; an N-type source diffusion layer 104; an N-type drain diffusion layer 105; a floating gate 210; an isolation layer 213; a silicide 204 (204a to 204c); an interlayer insulating film 205; a contact plug 206 (206a, 206b); and a metal wiring 207 (207a, 207b).

The non-volatile semiconductor memory 1 is arranged so that a source region 5, a drain region 6, and a gate region 7 are defined as illustrated in FIG. 1, as viewed from the top. Specifically, the source region 5 and the drain region 6 occur alternately in stripes, with the gate region 7 in between. Note that the width of the drain region 6 is wider than the width of the source region 5 or the gate region 7. Further, the source region 5 and the gate region 7 may be wider than the other or the same in width.

In the above arrangement, lines that surround the source region 5 define a first space above the substrate, along substrate normal lines that intersect the lines surrounding the source region 5. The first space includes the source diffusion layer 104, the silicide 204a, and the contact plug 206a, among other members. Further, the lines that surround the drain region 6 define a second space above the substrate, along substrate normal lines that intersect the lines surrounding the drain region 6. The second space includes the drain diffusion layer 105, the isolation layer 213, the silicide 204b, and the contact plug 206b, among other members. Finally, lines that surround the gate region 7 define a third space above the substrate, along substrate normal lines that intersect the lines surrounding the gate region 7. The third space includes the floating gate 210, the control gate 103, and the silicide 204c, among other members.

Figure 2:
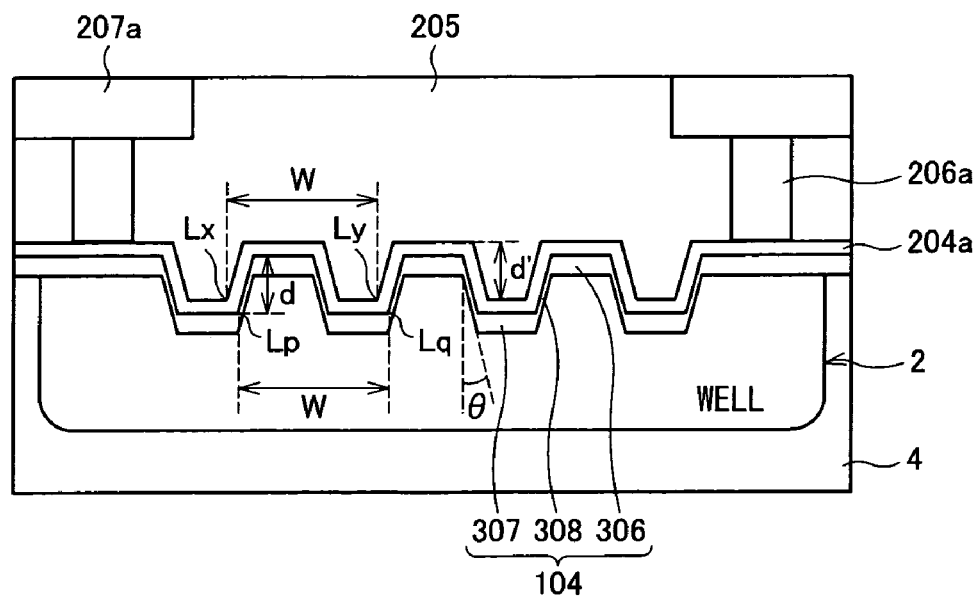
FIG. 2 is a cross sectional diagram of the non-volatile semiconductor memory, taken along a plane that includes (i) broken line A-A in FIG. 1 and (ii) a normal line of the substrate.

FIG. 2 is a cross sectional diagram of the non-volatile semiconductor memory 1, cutting across the non-volatile semiconductor memory 1 from its surface to a bottom face of the substrate along a plane that includes (i) broken line A-A (straight line along the direction of extension of the source diffusion layer 104) in the source region 5 and (ii) normal line of the substrate 4. The cross section is constituted of the following components, which are listed in the order as arranged: the interlayer insulating film 205 and the metal wiring 207a (the order may be reversed); the contact plug 206a; the silicide 204a; the source diffusion layer 104; the well 2; and the substrate 4.

In the cross section, one side (surface side) of the well 2 has protrusion portions and depressed portions (depressed portions and protrusion portions), and the source diffusion layer 104 is formed thereon. Accordingly, the source diffusion layer 104 also has protrusion portions and depressed portions in the cross section. The source diffusion layer 104 is formed of a series of (i) an upper-wall layer 306, which corresponds to the protrusion portions, (ii) a lower-wall layer 307, which corresponds to the depressed portions, and (iii) a side-wall layer 308. The upper-wall layer 306 and the lower-wall layer 307 occur alternately, with the side-wall layer 308 in between. In other words, the source diffusion layer 104 has a structure in which the upper-wall layer 306, the lower-wall layer 307, and the side-wall layer 308 are arranged to form a series of protrusion portions and depressed portions along the direction of extension of the source diffusion layer 104.

Further, the silicide 204a is formed to cover the source diffusion layer 104 (the upper-wall layer 306, the lower-wall layer 307, the side-wall layer 308). Accordingly, the silicide 204a also has protrusion portions and depressed portions in the cross section. Note that the silicide 204a is connected to the metal wiring 207a via the contact plug 206a. The source diffusion layer 104 is formed by impurity ion-implantation on the semiconductor substrate.

Further, in FIG. 2, the portions other than the metal wiring 207a, the contact plug 206a, the silicide 204a, the source diffusion layer 104, the well 2, and the substrate 4 constitute the interlayer insulating film 205.

As illustrated in FIG. 2, the source diffusion layer 104 of the non-volatile semiconductor memory 1 is arranged such that a distance d between (i) the interface between the upper-wall layer 306 and the silicide 204a and (ii) the interface between the lower-wall layer 307 and the silicide 204a is 1000 Å or shorter. Further, a distance d' between (i) the interface between the interlayer insulating film 205 and the silicide 204a on the upper-wall layer 306 and (ii) the interface between the interlayer insulating film 205 and the silicide 204a on the lower-wall layer 307 is 1000 Å or shorter. In other words, the depth d' of the protrusion portions or depressed portions of the silicide 204a formed on the source diffusion layer 104 is 1000 Å or shorter.

The following describes this from another point of view. Suppose that a distance between edges (Lp, Lq) on the same side (in the figure, on the right hand side) of two adjacent lower-wall layers 307 is W along the direction of extension (in the figure, the direction indicated by the arrow). In other words, if it is supposed that a distance (interval) between adjacent rise points (Lx, Ly) that lie on the interface between the silicide 204a and the interlayer insulating film 205 along the direction of extension is W, it can be said that d and d' satisfy the following relationships: $d \leq W/2$; and $d' \leq W/2$.

Accordingly, by making the depressed portions (trench) of the source diffusion layer 104 shallow, the proportion of the side-wall layer 308 in the source diffusion layer 104 can be reduced. This makes it possible to shorten the path of the source diffusion layer 104, and therefore the resistance thereof can be reduced. Further, because the resistance is reduced by forming the silicide, it is not necessary to reduce the resistance when forming the source diffusion layer 104 by impurity implantation. This makes it possible to perform the implantation with less energy and less dosage. Therefore, the source diffusion layer 104 can be prevented from expanding in the width direction, and miniaturization of the semiconductor memory 1 can be realized. Further, in forming the silicide 204*a*, the metal film (e.g., cobalt film) can be deposited with good coverage. Therefore, (i) an increase in resistance and (ii) wire breakage, both of which may occur if the silicide 204*a* is formed improperly, can be prevented. Further, because no isolation layer is formed and the source diffusion layer 104 is continuously formed, less implantation energy (than that in the case where the isolation layer is provided) is required for the impurity implantation performed to form the source diffusion layer 104. As a result, (i) miniaturization of the non-volatile semiconductor memory 1 and (ii) reduction in the resistance of the source diffusion layer 104 can be realized.

Further, the angle θ formed by (i) the side-wall layer 308 and (ii) the normal line of the lower-wall layer 307 (normal line of the substrate 4) is set to be 20° or wider. This makes it possible to shorten the path of the source diffusion layer 104 (length of the continuous source diffusion layer), and therefore the resistance thereof can be reduced. Further, in forming the silicide, the metal film (e.g., cobalt film) can be deposited with good coverage. Therefore, (i) an increase in resistance and (ii) wire breakage, both of which may occur if the silicide 204*a* is formed improperly, can be prevented.

Figure 3:
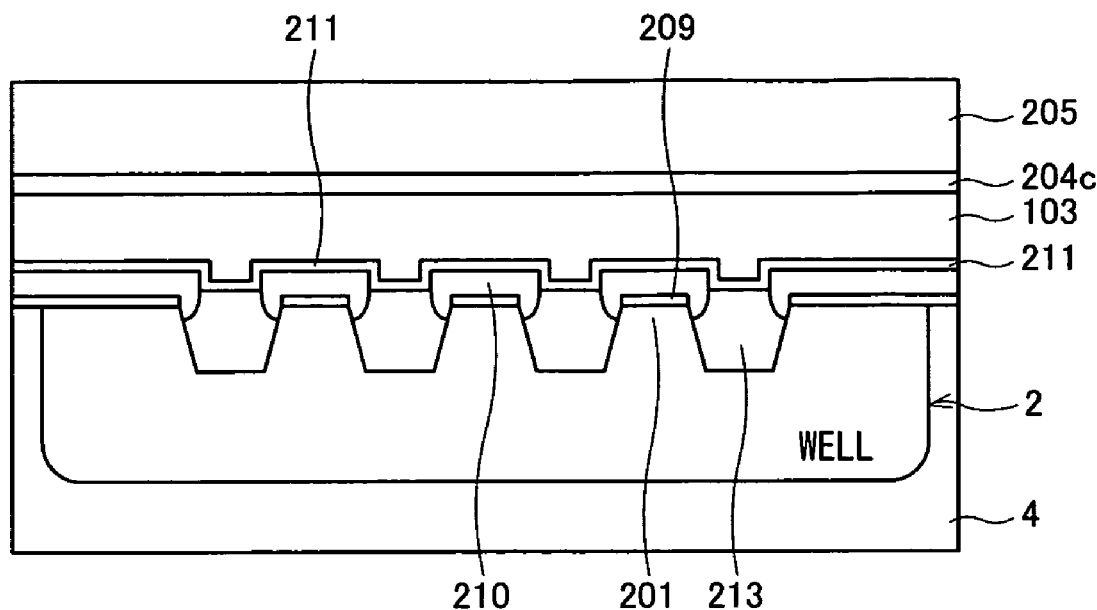
FIG. 3 is a cross sectional diagram of the non-volatile semiconductor memory, taken along a plane that includes (i) broken line B-B in FIG. 1 and (ii) a normal line of the substrate.

FIG. 3 is a cross sectional diagram of the non-volatile semiconductor memory 1, cutting across the non-volatile semiconductor memory 1 from its surface to a bottom face of the substrate along the plane that includes (i) a broken line B-B (straight line along the direction of extension of the control gate 103) of the gate region 7 and (ii) normal line of the substrate 4. The cross section is constituted of the following components, which are listed in the order as arranged: the interlayer insulating film 205; the silicide 204*c*; the control gate 103; an ONO insulating layer 211; the floating gate 210; an isolation layer 213; a gate oxide film 209; a channel layer 201; the well 2; and the substrate 4.

In the cross section, one side (substrate side) of the well 2 has protrusion portions and depressed portions (depressed portions and protrusion portions). On the protrusion portions, the channel layer 201 is formed. On the depressed portions, the isolation layer 213 is formed to fill in the depressed portions. As a result, the channel layer 201 is physically and electrically isolated by the isolation layer 213. On top of the channel layer 201, the gate oxide film 209 is formed. Further, the floating gate 210 is formed to cover the gate oxide film 209. The floating gate 210 is also isolated by the isolation layer 213. On the floating gate 210, the ONO insulating layer 211 is continuously formed, and the control gate 103 is continuously formed thereon. Further, on the control gate 103, the silicide 204*c* is continuously formed. Finally, on the silicide 204*c*, the interlayer insulating film 205 is continuously formed.

Figure 4:
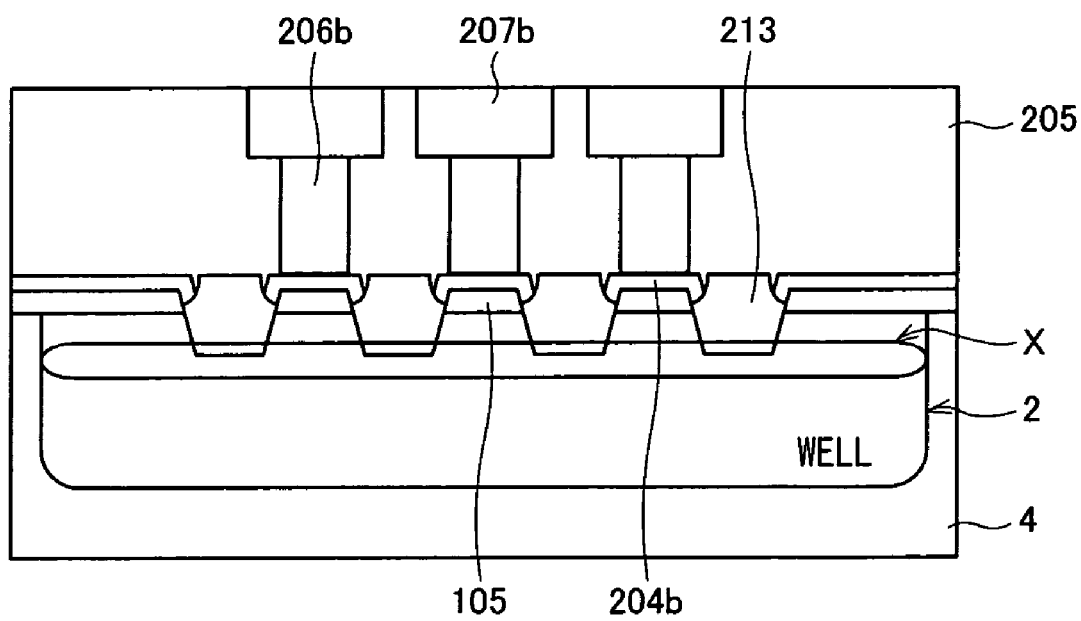
FIG. 4 is a cross sectional diagram of the non-volatile semiconductor memory, taken along a plane that includes (i) broken line C-C in FIG. 1 and (ii) a normal line of the substrate.

FIG. 4 is a cross sectional diagram of the non-volatile semiconductor memory 1, cutting across the non-volatile semiconductor memory 1 from its surface to a bottom face of the substrate along the plane that includes (i) broken line C-C (straight line extending along the direction of extension of the drain diffusion layer 105) of the drain region 6 and (ii) normal line of the substrate 4. The cross section is constituted of the following components, which are listed in the order as arranged: the metal wiring 207*b* and the interlayer insulating film 205; the contact plug 206*b*; the silicide 204*b* and the isolation layer 213; the drain diffusion layer 105; the well 2; and the substrate 4.

In the cross section, one side (substrate side) of the well 2 has protrusion portions and depressed portions (depressed portions and protrusion portions). On the protrusion portions, the drain diffusion layer 105 is formed. On the depressed portions, the isolation layer 213 is formed to fill in the depressed portions. As a result, the drain diffusion layer 105 is physically and electrically isolated by the isolation layer 213. On the drain diffusion layer 105, the silicide 204*b* is formed. The silicide 204*b* is also isolated by the isolation layer 213. Note that the silicide 204*b* is connected to the metal wiring 207*b* via the contact plug 206*b*.

Further, in the overlying layer of the silicide 204*b* and the isolation layer 213 in FIG. 4, the portions of the layer other than the contact plug 206*b* and the metal wiring 207*b* constitute the interlayer insulating film 205.

Figure 5:
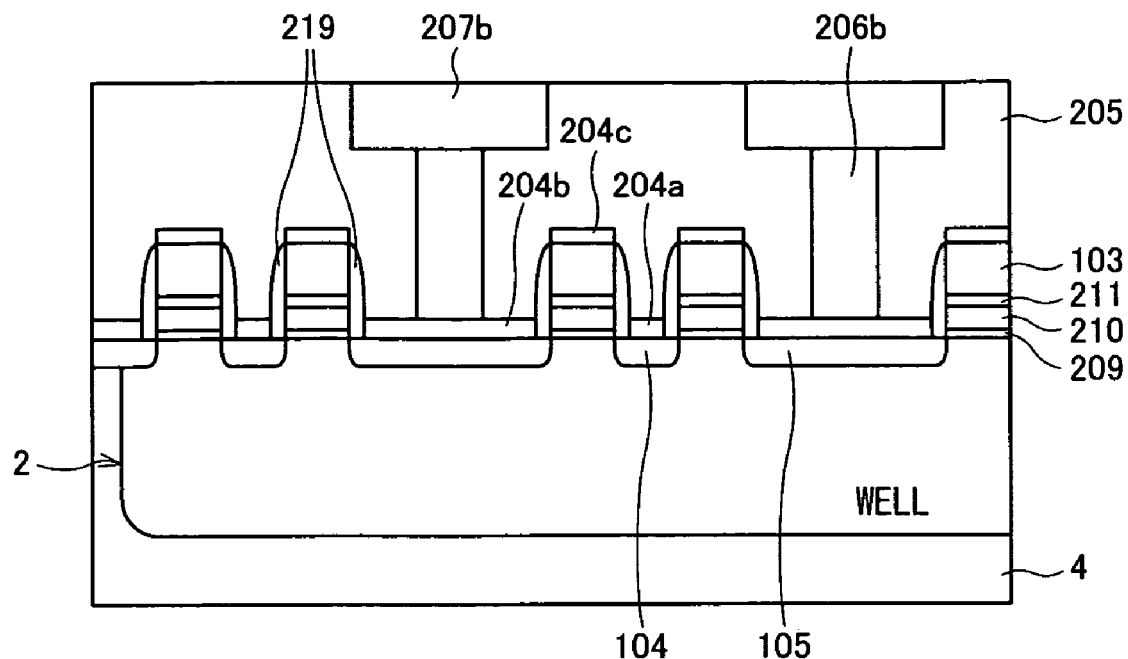
FIG. 5 is a cross sectional diagram of the non-volatile semiconductor memory, taken along a plane that includes (i) broken line D-D in FIG. 1 and (ii) a normal line of the substrate.

FIG. 5 is a cross sectional diagram of the non-volatile semiconductor memory 1, cutting across the non-volatile semiconductor memory 1 from its surface, through the drain diffusion layer 105, to a bottom face of the substrate along the plane that includes (i) broken line D-D that cuts across the source region 5, the drain region 6, and the gate region 7 and (ii) the normal line of the substrate 4. The cross section is constituted of the following components, which are listed in the order as arranged: the metal wiring 207*b* and the interlayer insulating film 205 (the order may be reversed); the contact plug 206*b*; the silicide 204*c*; the control gate 103 and the side wall 219 (the order may be reversed); the ONO insulating layer 211; the floating gate 210; the silicides 204*a*, 204*b*; the gate oxide film 209; the source diffusion layer 104 and the drain diffusion layer 105 (the order may be reversed); the well 2; and the substrate 4.

In the cross section, one side (substrate side) of the well 2 has protrusion portions and depressed portions (depressed portions and protrusion portions). The source diffusion layer 104 and the drain diffusion layer 105 are alternately formed in the depressed portions, whereas the gate oxide films 209 are formed on the protrusion portions (regions sandwiched by the source diffusion layer 104 and the drain diffusion layer 105 on the substrate 4). On the source diffusion layer 104, the silicide 204*a* is formed. On both side edges (of the source diffusion layer 104), the side wall 219 is formed. In the same manner, on the drain diffusion layer 105, the silicide 204*b* is formed. On both side edges (of the drain diffusion layer 105), the side wall 219 is formed.

On the gate oxide film 209, the floating gate 210 is formed. On the floating gate 210, the control gate 103 is formed, with the ONO insulating layer 211 formed in between. In this arrangement, the side wall 219 covers both side faces of the control gate 103, the ONO insulating layer 211, the floating gate 210, and the gate oxide film 209. Further, the silicide 204*c* is formed on the control gate 103.

As a result, a memory cell transistor constituted of the gate oxide film 209, the floating gate 210, the ONO insulating layer 211, and the control gate 103 is formed between the source diffusion layer 104 and the drain diffusion layer 105. The side walls 219 (insulating layer) formed on the both side faces of the memory cell transistor isolate, together with the silicides 204*a* and 204*b*, the memory cell transistor. Note that the silicide 204*b* is connected to the metal wiring 207*b* via the contact plug 206*b*.

Further, in FIG. 5, the portions other than the metal wiring 207*b*, the contact plug 206*b*, the control gate 103, the side wall 219, the ONO insulating layer 211, the floating gate 210, the silicides 204*a* to 204*c*, the gate oxide film 209, the source diffusion layer 104 and the drain diffusion layer 105, the well 2, and the substrate 4 constitute the interlayer insulating film 205.

Figure 6:
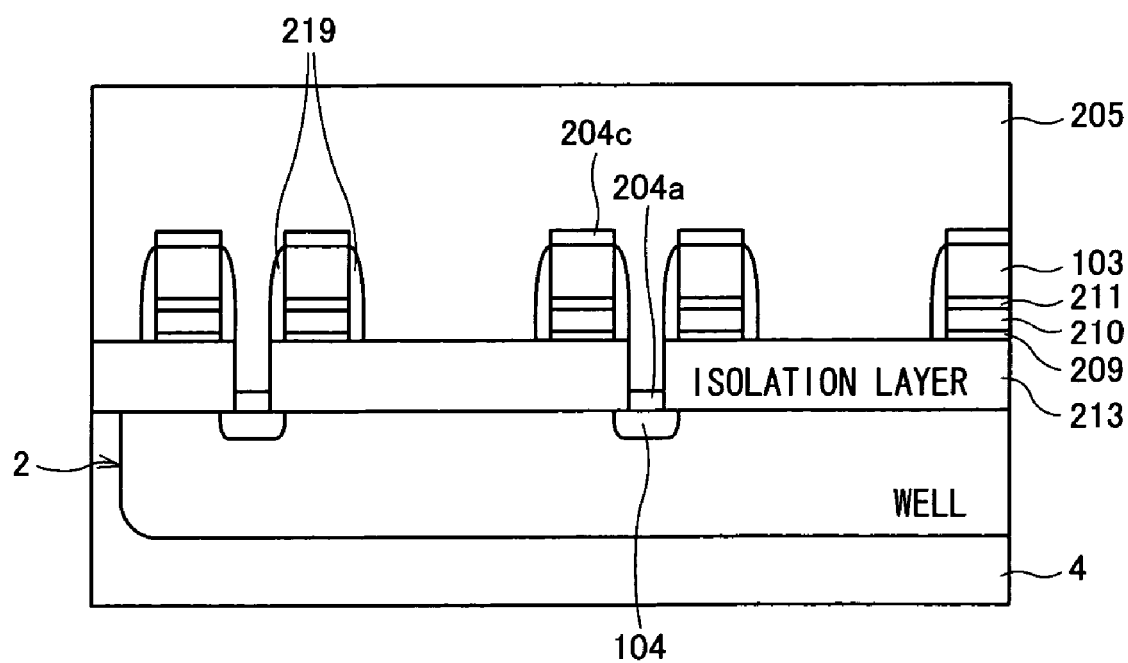
FIG. 6 is a cross sectional diagram of the non-volatile semiconductor memory, taken along a plane that includes (i) broken line E-E in FIG. 1 and (ii) a normal line of the substrate.
Figure 7:
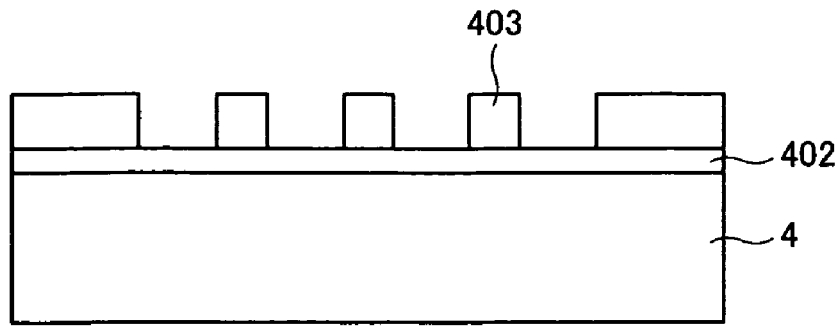
FIGS. 7(a) to 7(d) are diagrams illustrating a fabrication process of the non-volatile semiconductor memory.
Figure 7:
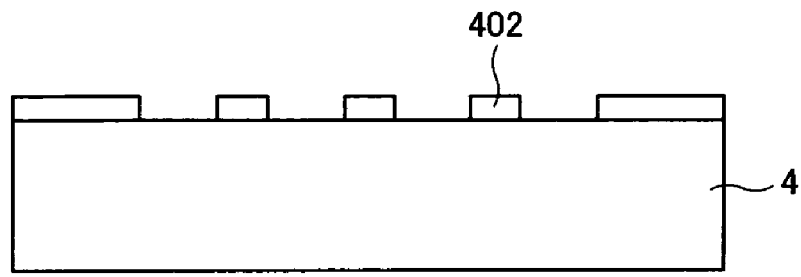
Figure 7:
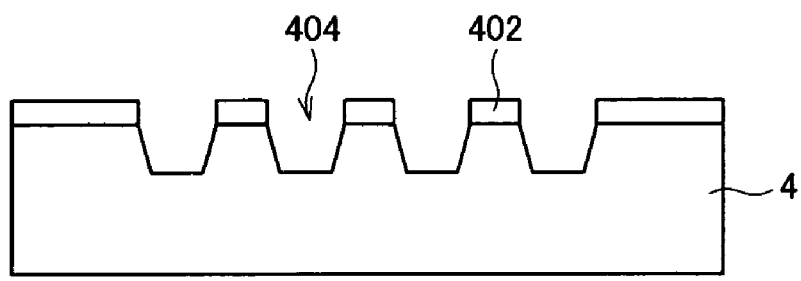
Figure 7:
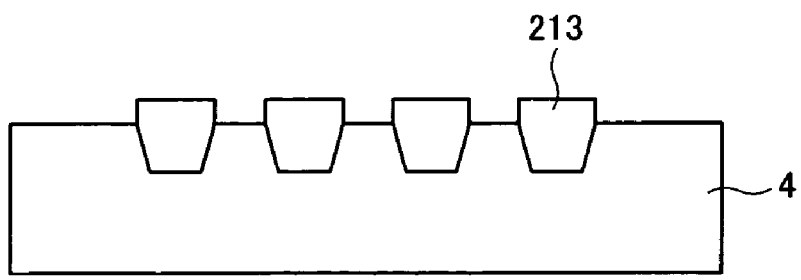
Figure 8:
FIGS. 8(a) to 8(c) are diagrams specifically illustrating a part of the fabrication process.
Figure 8:
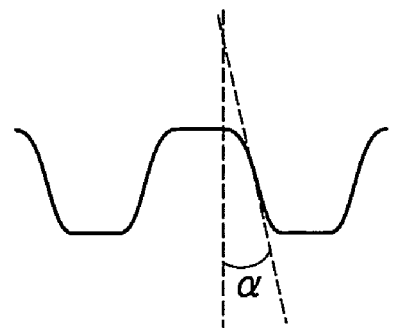
Figure 8:
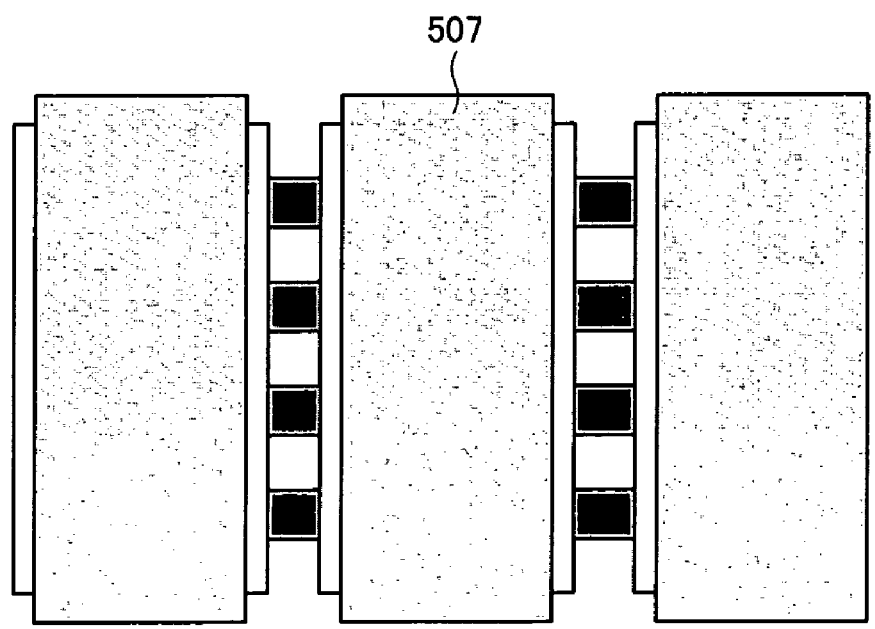

FIG. 6 is a cross sectional diagram of the non-volatile semiconductor memory 1, cutting across the non-volatile semiconductor memory 1 from its surface, through the isolation layer 213 (avoiding the drain diffusion layer), to a bottom face of the substrate along the plane that includes (i) broken line E-E that cuts across the source region 5, the drain region 6, and the gate region 7 and (ii) normal line of the substrate 4. The cross section is constituted of the following components, which are listed in the order as arranged: the interlayer insulating film 205; the silicide 204c; the control gate 103 and the side wall 219 (the order may be reversed); the ONO insulating layer 211; the floating gate 210; the gate oxide film 209; the isolation layer 213; the silicide 204a; the source diffusion layer 104; the well 2; and the substrate 4.

In the cross section, one side (substrate side) of the well 2 has depressed portions with certain intervals (intervals of the source regions 5). The source diffusion layer 104 is formed to fill in the depressed portions, whereas the isolation layer 213 is formed on non-depressed portions. Further, on the source diffusion layer 104, the silicide 204a is formed. The thickness of the silicide 204a is thinner than that of the isolation layer 213 (thickness in the direction of the normal line of the substrate). As a result, the isolation layer 213 is formed with intervals, and the silicide 204a is placed in the respective intervals. Further, the width (length in the direction orthogonal to the direction of extension) of the silicide 204a is shorter than that (length in the direction orthogonal to the direction of extension) of the source diffusion layer 104. As a result, the silicide 204a and the well 2 are electrically isolated from each other.

Further, on both side edges of the isolation layer 213, the gate oxide film 209 is formed. On the gate oxide film 209, the floating gate 210 is formed. On the floating gate 210, the control gate 103 is formed, with the ONO insulating layer 211 formed in between. Further, the side wall 219 is formed to cover the both side faces of the gate oxide film 209, the floating gate 210, the ONO insulating layer 211, and the control gate 103. Further, the silicide 204c is formed on the control gate 103. Note that the silicide 204a is connected to the metal wiring 207a via the contact plug 206a.

Further, in FIG. 6, the portions other than the control gate 103, the side wall 219, the ONO insulating layer 211, the floating gate 210, the gate oxide film 209, the isolation layer 213, the silicides 204a and 204c, the source diffusion layer 104, the well 2, and the substrate 4 constitute the interlayer insulating film 205.

As a result, the same memory cell transistor as that illustrated in FIG. 5 is formed on the isolation layer 213. Note that the source diffusion layer 104 and the silicide 204 are formed after the isolation layer 213 has been removed by etching.

The non-volatile semiconductor memory 1 can be used as a flash memory if (i) the control gate 103 is connected to a word line, and the drain diffusion layer 105 is connected to a bit line via the contact plug 206b, (ii) the source diffusion layer 104 is grounded via the contact plug 206a, and (iii) the well 2 is also grounded. Specifically, in order to write an information "1", the source diffusion layer 104 and the well 2 are grounded, and a high voltage is applied to the drain diffusion layer 105 and the control gate 103. On the other hand, in order to erase, (i) a high voltage (positive potential) is applied to the well 2, (ii) the source diffusion layer 104 and the drain diffusion layer 105 are opened, and (iii) either a negative voltage or a GND potential is applied to the control gate 103 (the substrate is erased). An alternative way of erasing is that (i) the well 2 is grounded, (ii) a negative voltage is applied to the control gate 103, and (iii) the a high voltage is applied to the source diffusion layer 104 with the drain diffusion layer 105 opened (the source is erased).

The following describes what the respective components of the non-volatile semiconductor memory 1 are made of. The substrate 4 is a P-type substrate. The well 2 is made of P-type silicon. The source diffusion layer 104 is made of N-type silicon with an impurity of either As (arsenic) or P (phosphorus). The drain diffusion layer 105 is also made of N-type silicon with an impurity of either As (arsenic) or P (phosphorus). The control gate 103 is made of PolySi (polycrystalline silicon). The floating gate 210 is made of PolySi (polycrystalline silicon). The isolation layer 213 is made of $SiO_2$. The gate oxide film 209 is made of $SiO_2$. The silicide 204 (204a, 204b) is made of Co (cobalt). The interlayer insulating film 205 is made of $SiO_2$. The ONO insulating layer 211 is made of $SiO_2$, SiN, and $SiO_2$ (SiN sandwiched by two layers of $SiO_2$). The side wall is made of $SiO_2$. The contact plug 206 (206a, 206b) is made of W (tungsten). Finally, the metal wiring 207 (207a, 207b) is made of Al (aluminum).

In the non-volatile semiconductor memory 1 of the present invention, the distance between (i) the interface between the silicide 204a and the upper-wall layer 306 formed on the protrusion portion of the well 2 and (ii) the interface between the silicide 204a and the lower-wall layer 307 formed on the depressed portion of the well 2 is set to 1000 Å or shorter, and the source diffusion layer 104 is turned into a silicide under such a dimension. Accordingly, by making the depressed portions (trench) of the well 2 shallow, the proportion of the side-wall layer 308 in the source diffusion layer 104 is reduced. This makes it possible to shorten the path of the source diffusion layer 104, and therefore the resistance thereof can be reduced. Further, in depositing the metal film (e.g., cobalt film) to form the silicide, the metal film can be deposited with good coverage, and wire breakage due to improperly formed silicide can be prevented.

Further, by inclining the side-wall layer 308 at an angle of 20° or greater with respect to the normal line (vertical direction) of the substrate 4, the path of the source diffusion layer 104 can be shortened, and therefore the resistance thereof can be reduced. Further, in depositing the metal film (e.g., cobalt film) to form the silicide, the metal film can be deposited with good coverage, and wire breakage due to improperly formed silicide can be prevented. Note that the impurity ion-implantation angle is not limited to a particular angle. Furthermore, the number of implantations is not particularly limited either.

The following describes a method of manufacturing the non-volatile semiconductor memory 1, with reference to FIGS. 7(a) to 7(d) and FIGS. 8(a) to 8(c).

First of all, on the silicon substrate 4, a SiN 402 that acts as a hard mask is deposited. Then, a resist mask 403 (mask used for forming a trench for isolation) is formed using a known photolithography technique. Then, by using the resist mask 403 as a mask, dry etching is performed on the SiN 402 so as to form a pattern. Then, by using the SiN 402 as a hard mask, dry etching is performed on the silicon substrate 4 so as to form a trench (depressed portion) 404 (see FIGS. 7(a) to 7(c)).

In this method, as illustrated in FIG. 8(a), the difference (depth of the trench) D between the top surface of the protrusion portion and the bottom surface of the depressed portion is set at, for example, 1020 [Å], and the trench angle α is set at, for example, 20[°]. In this step, the difference D and the angle α are set such that (i) the depth d (see FIG. 2) in the final shape of the trench illustrated in FIG. 1 is 1000 Å or shorter and (ii) the trench angle θ is 20° or wider, taking into consideration that, during the subsequent steps (e.g., gate oxidation), (i) the trench may become shallower due to erosion of Si, or (ii) the shape may be changed by the cobalt silicide. Further, in this step, (i) a mixture of HBr and $O_2$ gas is used in place of a mixture of HBr, $Cl_2$, and $O_2$ gas commonly used in Si etching, (ii) the processing pressure is set higher than a normal level, and (iii) a low bias power is set. As a result, it becomes possible to (i) make the Si trench shallow and (ii) provide a trench angle (20° or below).

Figure 9:
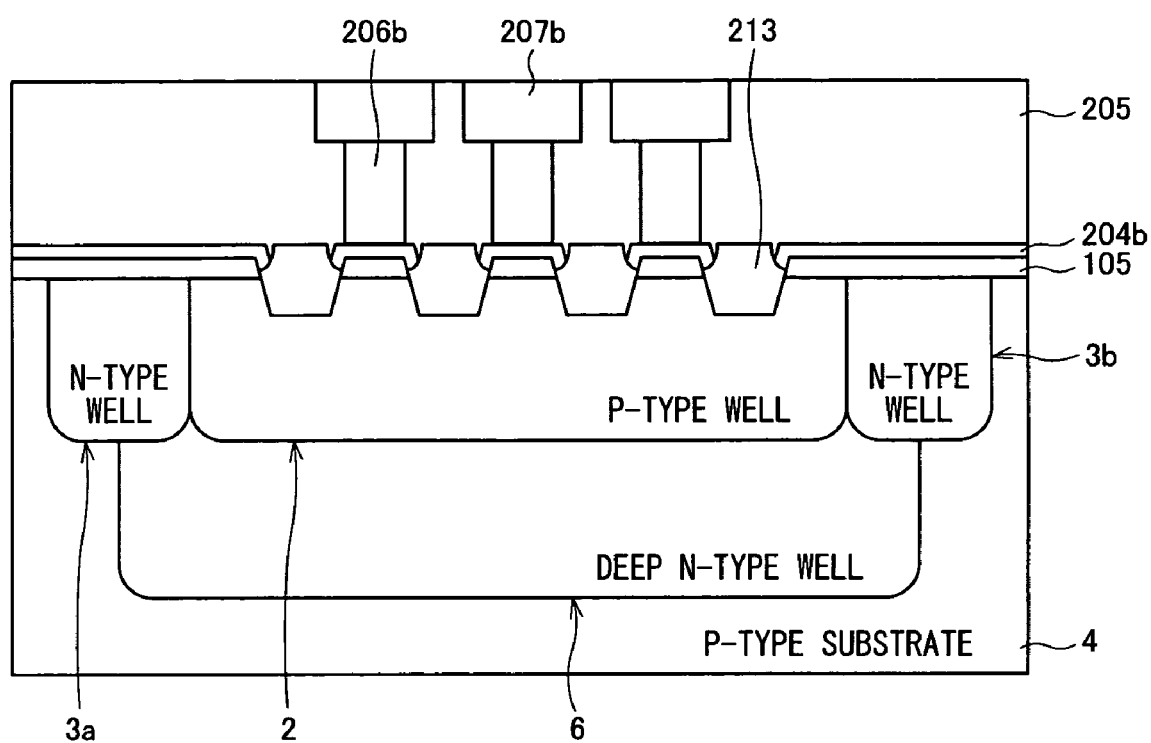
FIG. 9 is a cross sectional diagram illustrating a structure of a well that can be realized by the non-volatile semiconductor memory.

Then, a sacrificed oxidation is performed on the trench so as to eliminate damages caused by the etching, and a $SiO_2$ film is deposited. Further, planarization is performed with CMP (chemical mechanical polish). Then, the SiN is removed, and the formation of the isolation layer 213 is completed (FIG. 7(d)). Note that the isolation may be formed on the epitaxial layer substrate, instead of the P-type silicon substrate, in the same manner as described above. Then, the well 2 (see FIG. 1), the gate oxide film 209, the floating gate 210, the ONO insulating layer 211, and the control gate 103 are formed using a known technique. The well may have a triple well structure as illustrated in FIG. 9. Specifically, as illustrated in FIG. 9, a P-type well 2 is formed on the P-type substrate, with an N-type deep well 6 and wells 3a and 3b surrounding the P-type well 2. As a result, the P-type well 2 is isolated from the substrate 4, so that the substrate can be erased in the manner as described above.

Then, the source diffusion layer 104 is formed by the method below.

First of all, as illustrated in FIG. 8(c), the regions other than those where a source diffusion layer is to be formed are covered by the resist mask 507, using a known photolithography technique. Then, the isolation layer 213 underneath the source region 5 (see FIG. 1) is removed by dry etching, so as to remove the resist mask 507.

Then, a resist mask is formed using a known technique in such a way as to cover the regions other than those where either the source diffusion layer or the drain diffusion layer is to be formed. Then, arsenic ion-implantation is performed with an ion implanter. The implantation is performed with an implantation energy of 15K [eV], the dosage of $4.0 \times 10^{14}/cm^2$, and the implantation angle of 0[°]. Consequently, the source diffusion layer 104 and the drain diffusion layer 105 are formed. Thereafter, the resist mask is removed.

Then, on both side faces of the memory cell transistor, the side wall is formed. At this time, the insulating layer used for forming the side wall is also deposited on the source diffusion layer. Therefore, in the same manner as illustrated in FIG. 8(c), (i) the regions other than the source diffusion layer is covered by the resist mask 507, using a photolithography technique, (ii) the insulating layer deposited on the source diffusion layer 509 is removed by dry etching, and finally (iii) the resist mask 507 is removed.

Then, cobalt is deposited to 200 Å using a sputtering technique, and is heated using an RTA (rapid thermal anneal) technique. Then, the cobalt film is removed. As a result, the source diffusion layer 104, the drain diffusion layer 105, and the control gate 103 are turned into silicides (silicides 204a, 204b, 204c are formed). Finally, the metal wiring 207 is formed using a known technique, so as to complete the fabrication of the non-volatile semiconductor memory 1.

As a result, the non-volatile semiconductor memory 1 as illustrated in FIGS. 2 to 6 is formed.

Note that, in order to prevent reduction in the isolation breakdown voltage, which may occur if the trench is shallow, it is preferable that the well (for example, the well in the region X illustrated in FIG. 4) under the isolation layer have high impurity density. In the present embodiment, implantation of boron is performed twice during the formation of the well. The first implantation is performed with the implantation energy of 200K [eV] and the dosage of $7.6 \times 10^{12}/cm^2$. The second implantation is performed with the implantation energy of 100K [eV] and the dosage of $7.0 \times 10^{12}/cm^2$. As a result, a region down to approximately 8000 Å from the surface becomes the well. The well has different densities at different depths. As the density of the region X (substrate-side region of the isolation layer 213) in FIG. 4 increases, the breakdown voltage (isolation breakdown voltage) across drains that sandwiches the isolation layer 213 in between also increases. However, if the density is too high, the breakdown voltage junction breakdown voltage) across the drain and the well becomes low. Therefore, the implantation energy and the dosage are adjusted to achieve optimum isolation breakdown voltage and optimum junction breakdown voltage. Note that the width of the isolation layer 213 may be widened. Furthermore, the source diffusion layer 104 and/or the drain diffusion layer 105 may be formed in a shallower portion.

According to one aspect of the present invention, there is provided a non-volatile semiconductor memory having a source diffusion region continuously formed on a surface of the semiconductor, wherein (i) the source diffusion region has depressed portions and protrusion portions that occur continuously and alternately in a cross section taken along a direction parallel to the direction of extension of the source diffusion region, (ii) the depth from the top surface of the protrusion portion to the bottom surface of the depressed portion is 1000 Å or shorter, and (iii) the source region is turned into a silicide.

The semiconductor memory of the present invention includes a source diffusion region having a low resistance, and is suitable for a non-volatile semiconductor (e.g., flash memory), for example.

As the foregoing describes, with the present invention, a path of the source diffusion layer can be shortened, and therefore the resistance thereof can be reduced. Further, because the reduction in resistance is achieved by forming the silicide, it is not necessary to reduce the resistance at the time of forming the source diffusion layer by ion implantation. This makes it possible to perform the implantation with less energy and less dosage. Therefore, the width (length orthogonal to the direction of extension) of the source diffusion layer can be prevented from expanding, and miniaturization of the semiconductor memory can be realized. Further, in depositing the metal film (e.g., cobalt film) to form the silicide, the metal film can be deposited with good coverage. Therefore, (i) an increase in resistance and (ii) wire breakage, both of which may occur if the silicide is formed improperly, can be prevented. As a result, (i) miniaturization of the semiconductor memory and (ii) reduction in the resistance of the source diffusion layer can be realized.

According to one aspect of the invention, there is provided a semiconductor memory in which a source diffusion layer and a drain diffusion layer are formed in stripes on a semiconductor substrate: the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer; a silicide is formed to cover the upper-wall layer, the lower-wall layer, and the side-wall layer; an insulating layer is formed to cover the silicide; and a distance between (a) an interface between the insulating layer and the silicide formed on the upper-wall layer and (b) an interface between the insulating layer and the silicide formed on the lower-wall layer is 1000 Å or shorter. Accordingly, by making the depressed portions (trench) of the source diffusion layer shallow, the proportion of the side-wall layer in the source diffusion layer can be reduced. This makes it possible to shorten the path of the source diffusion layer, and therefore the resistance thereof can be reduced. Further, because the resistance is reduced by forming the silicide, it is not necessary to reduce the resistance at the time of forming the source diffusion layer by impurity implantation. This makes it possible to perform the implantation with less energy and less dosage. Therefore, the source diffusion layer can be prevented from expanding in the width direction, and miniaturization of the semiconductor memory can be realized. Further, in forming the silicide, the metal film (e.g., cobalt film) can be deposited with good coverage. Therefore, (i) an increase in resistance and (ii) wire breakage, both of which may occur if the silicide is formed improperly, can be prevented. As a result, (i) miniaturization of the semiconductor memory and (ii) reduction in the resistance of the source diffusion layer can be realized.

Further, in order to solve the above problems, the nonvolatile semiconductor memory of the present invention is adapted so that, in a semiconductor memory in which a source diffusion layer and a drain diffusion layer are formed on a semiconductor substrate: the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer; a silicide is formed to cover the upper-wall layer, the lower-wall layer, and the side-wall layer; and when a distance between (a) an interface between the upper-wall layer and the silicide and (b) an interface between the lower-wall layer and the silicide is d, and when a distance between edges of two adjacent lower-wall layers, which edges are located on a same side of the lower-wall layers along the direction of extension of the source diffusion layer is W, a relationship $d \leq W/2$ is satisfied.

With the above structure in which, (A) when the distance between (a) an interface between the upper-wall layer and the silicide and (b) an interface between the lower-wall layer and the silicide is d, and when a distance between edges of two adjacent lower-wall layers, which edges are on a same side in the extending direction, is W, a relationship defined as $d \leq W/2$ is satisfied, and (B) the depressed portion (trench) of the source diffusion layer is shallow, the proportion of the side-wall layer in the source diffusion layer can be reduced. Further, with the above structure, a path of the source diffusion layer can be shortened, and therefore the resistance thereof can be reduced. Further, because the resistance is reduced by forming the silicide, it is not necessary to reduce the resistance at the time of forming the source diffusion layer by impurity implantation. This makes it possible to perform the implantation with less energy and less dosage. Therefore, the source diffusion layer can be prevented from expanding in the width direction (length orthogonal to the extending line), and miniaturization of the semiconductor memory can be realized. Further, in forming the silicide, the metal film (e.g., cobalt film) can be deposited with good coverage. Therefore, (i) an increase in resistance and (ii) wire breakage, both of which may occur if the silicide is formed improperly, can be prevented. As a result, (i) miniaturization of the semiconductor memory and (ii) reduction in the resistance of the source diffusion layer can be realized.

Further, in order to solve the above problems, the nonvolatile semiconductor memory of the present invention is adapted so that, in a semiconductor memory in which a source diffusion layer and a drain diffusion layer are formed on a semiconductor substrate: the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer; a silicide is formed to cover the upper-wall layer, the lower-wall layer, and the side-wall layer, and an insulating layer is formed to cover the silicide; and when a distance between (a) an interface between the insulating layer and the silicide formed on the upper-wall layer and (b) an interface between the insulating layer and the silicide formed on the lower-wall layer is d', and when a distance between adjacent rise points that lie on the interface between the silicide and the insulating layer along the direction of extension of the source diffusion layer is W, a relationship $d' \leq W/2$ is satisfied.

As described above, by making the depressed portion (trench) of the source diffusion layer shallow, the proportion of the side-wall layer in the source diffusion layer can be reduced. With the above structure, the path of the source diffusion layer can be shortened, and therefore the resistance thereof can be reduced. Further, because the resistance is reduced by forming the silicide, it is not necessary to reduce the resistance at the time of forming the source diffusion layer by impurity implantation. This makes it possible to perform the implantation with less energy and less dosage. Therefore, the source diffusion layer can be prevented from expanding in the width direction (length orthogonal to the extending line), and miniaturization of the semiconductor memory can be realized. Further, in forming the silicide, the metal film (e.g., cobalt film) can be deposited with good coverage. Therefore, (i) an increase in resistance and (ii) wire breakage, both of which may occur if the silicide is formed improperly, can be prevented. As a result, (i) miniaturization of the semiconductor memory and (ii) reduction in the resistance of the source diffusion layer can be realized.

Further, it is preferable in the semiconductor memory that the silicide be formed on the drain diffusion layer. In this way, the resistance of the drain diffusion layer can be reduced.

Further, it is preferable in the semiconductor memory that an angle between (i) the side-wall layer and (ii) the normal line of the lower-wall layer be 20° or greater. With the above structure, a path of the source diffusion layer (extending direction of a continuing source diffusion layer) can be shortened, and therefore the resistance thereof can be reduced. Further, in forming the silicide, the metal film (e.g., cobalt film) can be deposited with good coverage. Therefore, (i) an increase in resistance and (ii) wire breakage, both of which may occur if the silicide is formed improperly, can be prevented.

Further, it is preferable in the semiconductor memory that: the drain diffusion layer has a protrusion portion and a depressed portion on a cross section taken along a plane that includes (a) a straight line extending along a direction of extension of the drain diffusion layer and (b) a normal line of the semiconductor substrate; and an isolation layer is formed on the depressed portion of the drain diffusion layer, whereas no isolation layer is formed on the depressed portion of the source diffusion layer.

Further, it is preferable in the semiconductor memory that the source diffusion layer contain one of As and P.

Further, it is preferable in the semiconductor memory that the silicide be Co.

What is claimed is:

1. A semiconductor memory in which a source diffusion layer and a drain diffusion layer are formed on a semiconductor substrate,
wherein:
the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer;
a silicide is formed to cover the upper-wall layer, the lower-wall layer, and the side-wall layer; and
a distance between (a) an interface between the upper-wall layer and the silicide and (b) an interface between the lower-wall layer and the silicide is 1000 Å or shorter.

2. A semiconductor memory as set forth in claim 1, wherein the silicide is formed on the drain diffusion layer.

3. A semiconductor memory as set forth in claim 1, wherein an angle between (i) the side-wall layer and (ii) a normal line of the lower-wall layer is 20° or greater.

4. A semiconductor memory as set forth in claim 1, wherein:
the drain diffusion layer has a protrusion portion and a depressed portion on a cross section taken along a plane that includes (a) a straight line extending along a direction of extension of the drain diffusion layer and (b) a normal line of the semiconductor substrate; and
an isolation layer is formed on the depressed portion of the drain diffusion layer, whereas no isolation layer is formed on the depressed portion of the source diffusion layer.

5. A semiconductor memory as set forth in claim 4, wherein the isolation layer is $SiO_2$.

6. A semiconductor memory as set forth in claim 4, wherein the drain diffusion layer contains one of As and P.

7. A semiconductor memory as set forth in claim 1, wherein the source diffusion layer contains one of As and P.

8. A semiconductor memory as set forth in claim 1, wherein the silicide is Co.

9. A semiconductor memory in which a source diffusion layer and a drain diffusion layer are formed on a semiconductor substrate,
wherein:
the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer;
a silicide is formed to cover the upper-wall layer, the lower-wall layer, and the side-wall layer, and an insulating layer is formed to cover the silicide; and
a distance between (a) an interface between the insulating layer and the silicide formed on the upper-wall layer and (b) an interface between the insulating layer and the silicide formed on the lower-wall layer is 1000 Å or shorter.

10. A semiconductor memory as set forth in claim 9, wherein a silicide is formed on the drain diffusion layer.

11. A semiconductor memory as set forth in claim 9, wherein an angle between (i) the side-wall layer and (ii) the normal line of the lower-wall layer is 20° or greater.

12. A semiconductor memory as set forth in claim 9, wherein
the drain diffusion layer has a protrusion portion and a depressed portion on a cross section taken along a plane that includes (a) a straight line extending along a direction of extension of the drain diffusion layer and (b) a normal line of the semiconductor substrate; and
an isolation layer is formed on the depressed portion of the drain diffusion layer, whereas no isolation layer is formed on the depressed portion of the source diffusion layer.

13. A semiconductor memory as set forth in claim 12, wherein the isolation layer is $SiO_2$.

14. A semiconductor memory as set forth in claim 12, wherein the drain diffusion layer contains one of As and P.

15. A semiconductor memory as set forth in claim 9, wherein the source diffusion layer contains one of As and P.

16. A semiconductor memory as set forth in claim 9, wherein the silicide is Co.

17. A semiconductor memory in which a source diffusion layer and a drain diffusion layer are formed on a semiconductor substrate,
wherein:
the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer;
a silicide is formed to cover the upper-wall layer, the lower-wall layer, and the side-wall layer; and
when a distance between (a) an interface between the upper-wall layer and the silicide and (b) an interface between the lower-wall layer and the silicide is d, and when a distance between edges of two adjacent lower-wall layers, which edges are located on a same side of the lower-wall layers along the direction of extension of the source diffusion layer is W, a relationship $d \leq W/2$ is satisfied.

18. A semiconductor memory in which a source diffusion layer and a drain diffusion layer are formed on a semiconductor substrate,
wherein:
the source diffusion layer has a protrusion portion and a depressed portion on a cross section taken along a plane that includes (a) a straight line extending along a direction of extension of the source diffusion layer and (b) a normal line of the semiconductor substrate, and the source diffusion layer is formed of a series of (a) an upper-wall layer constituting the protrusion portion, (b) a lower-wall layer constituting the depressed portion, and (c) a side-wall layer between the upper-wall layer and the lower-wall layer;

a silicide is formed to cover the upper-wall layer, the lower-wall layer, and the side-wall layer, and an insulating layer is formed to cover the silicide; and when a distance between (a) an interface between the insulating layer and the silicide formed on the upper-wall layer and (b) an interface between the insulating layer and the silicide formed on the lower-wall layer is d', and when a distance between adjacent rise points that lie on the interface between the silicide and the insulating layer along the direction of extension of the source diffusion layer is W, a relationship $d' \leqq W/2$ is satisfied.

* * * * *